United States Patent
Uejima et al.

(10) Patent No.: US 8,253,483 B2
(45) Date of Patent: Aug. 28, 2012

(54) HIGH-FREQUENCY SWITCH MODULE

(75) Inventors: Takanori Uejima, Nagaokakyo (JP); Hisanori Murase, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 13/314,339

(22) Filed: Dec. 8, 2011

(65) Prior Publication Data

US 2012/0075002 A1 Mar. 29, 2012

Related U.S. Application Data

(63) Continuation of application No. PCT/JP2010/056906, filed on Apr. 19, 2010.

(30) Foreign Application Priority Data

Jun. 11, 2009 (JP) ................................. 2009-140047

(51) Int. Cl.
*H01L 25/00* (2006.01)
(52) U.S. Cl. ......... 327/564; 327/565; 327/551; 333/103
(58) Field of Classification Search .................. 327/551, 327/564, 565
See application file for complete search history.

(56) References Cited

U.S. PATENT DOCUMENTS

| | | | |
|---|---|---|---|
| 6,998,912 B2 * | 2/2006 | Kushitani et al. ............... | 330/51 |
| 7,280,006 B2 * | 10/2007 | Hase ............................. | 333/103 |
| 8,159,283 B2 * | 4/2012 | Sugiyama ..................... | 327/430 |
| 8,160,511 B2 * | 4/2012 | Uejima ......................... | 455/83 |

FOREIGN PATENT DOCUMENTS

| | | |
|---|---|---|
| JP | 63-122306 A | 5/1988 |
| JP | 08-204344 A | 8/1996 |
| JP | 2006-073673 A | 3/2006 |
| JP | 2006-211144 A | 8/2006 |
| JP | 2006-253834 A | 9/2006 |
| JP | 2007-129514 A | 5/2007 |
| JP | 2008-271420 A | 11/2008 |

OTHER PUBLICATIONS

Official Communication issued in International Patent Application No. PCT/JP2010/056906, mailed on Jun. 8, 2010.

* cited by examiner

*Primary Examiner* — Kenneth B. Wells
(74) *Attorney, Agent, or Firm* — Keating & Bennett, LLP

(57) ABSTRACT

A high-frequency switch module that significantly reduces deterioration of high-frequency characteristics and improves harmonic wave distortion characteristics includes a high-frequency switch and SAW filters mounted on a multilayer substrate. Low pass filters are provided within the multilayer substrate. The terminals of the high-frequency switch are located on the bottom surface of the semiconductor substrate. The high-frequency switch includes a high-frequency circuit ground terminal and a control circuit ground terminal, the multilayer substrate includes therein a ground electrode which is electrically connected to a top surface connection electrode to which the high-frequency circuit ground terminal is connected, and a wiring electrode electrically connected to a top surface connection electrode to which the control circuit ground terminal is connected is arranged so as to be insulated from the ground electrode.

6 Claims, 6 Drawing Sheets

HIGH-FREQUENCY SWITCH MODULE

BACKGROUND OF THE INVENTION

1. Field of the Invention

The present invention relates to modules including high-frequency switches, and specifically to a high-frequency switch module including a high-frequency switch including a common input/output terminal and a substrate on which the switch is mounted.

2. Description of the Related Art

Japanese Unexamined Patent Application Publication No. 2008-271420 discloses a high-frequency switch module for cellular phones.

FIG. 1 is a perspective view of a high-frequency switch module disclosed in Japanese Unexamined Patent Application Publication No. 2008-271420. In this high-frequency switch module 1, SAW filters 50, 55, and 60, capacitors C1, C2, and C3, and an inductor L1, together with an FET switch circuit, are mounted on a multilayer substrate 5. The FET switch circuit includes transmission signal terminals, reception signal terminals, and an antenna terminal. In addition, control signal terminals for selectively connecting the antenna terminal to a specified signal terminal are provided. It is stated in Japanese Unexamined Patent Application Publication No. 2008-271420 that in order to prevent deterioration of insertion loss characteristics in a pass band caused by leakage of part of a transmission signal or received signal to control terminals through control signal lines connected to the control signal terminals, a control circuit is isolated using a ground electrode, thereby improving isolation between the control signal lines and transmitter/receiver circuits.

In Japanese Unexamined Patent Application Publication No. 2008-271420, a plurality of ground electrodes are provided in the multilayer substrate and are connected to one another using via holes. The FET switch requires not only transmission/reception signal lines and corresponding ground lines, but also ground lines used to apply control signals for switching the switch.

When the control signal lines are arranged between a plurality of ground electrodes as described in Japanese Unexamined Patent Application Publication No. 2008-271420, direct interference between the control signal lines and the transmission/reception lines is reduced. However, when the ground electrode for the transmission/reception signals and the ground electrode for the control signal lines are the same electrode, a high-power signal leaks from the transmission terminals or the like to a logic circuit unit through the common ground electrode, resulting in a problem in that high-frequency characteristics such as the harmonic wave distortion characteristics of the switch are deteriorated because the logic circuit cannot operate normally.

SUMMARY OF THE INVENTION

Hence, preferred embodiments of the present invention provide a high-frequency switch module in which deterioration of high-frequency characteristics is prevented and significantly reduced, and, specifically, harmonic wave distortion characteristics are improved.

A high-frequency switch module according to a preferred embodiment of the present invention includes a high-frequency switch that includes high-frequency terminals, a control terminal, a power supply terminal, and ground terminals and that causes specified high-frequency terminals among the plurality of the high-frequency terminals be selectively electrically connected to one another; and a multilayer substrate having a rectangular-plate shape and including insulators and electrodes alternately stacked therein, wherein top surface connection electrodes to which the respective terminals of the high-frequency switch are connected are arranged on a top surface of the multilayer substrate, bottom surface connection electrodes which are connected to a circuit substrate to which the high-frequency switch module is mounted are arranged on a bottom surface of the multilayer substrate, and wiring electrodes that electrically connect the top surface connection electrodes to the bottom surface connection electrodes are provided within the multilayer substrate, the ground terminals include a high-frequency circuit ground terminal and a control circuit ground terminal, the multilayer substrate includes therein a ground electrode electrically connected to the top surface connection electrode to which the high-frequency circuit ground terminal is connected, and the wiring electrode electrically connected to the top surface connection electrode to which the control circuit ground terminal is connected is arranged so as to be insulated from the ground electrode.

This configuration enables prevention of interference between the ground path of the control circuit of the high-frequency switch and the ground path of a high-frequency signal, thereby preventing a high-frequency signal from leaking to the high-frequency switch through the ground paths and preventing noise generated in the control circuit (logic circuit unit) of the high-frequency switch from leaking to the transmission path of a high-frequency signal.

A wiring electrode (via hole), among the wiring electrodes, electrically connected to the top surface connection electrode to which the control circuit ground terminal is connected preferably is arranged at a position that is not surrounded by the ground electrode in plan view.

This configuration prevents generation of undesired capacitance between the ground path of the control circuit of the high-frequency switch and the ground electrode within the multilayer substrate, thereby preventing the leakage of a high-frequency signal and noise more reliably.

A wiring electrode, among the wiring electrodes, electrically connected to the top surface connection electrode to which the control circuit ground terminal is connected preferably is arranged under the top surface connection electrode to which the control circuit ground terminal is connected.

This configuration allows the control circuit ground terminal to be directly (without going through unnecessary wiring lines) connected to the bottom surface connection terminal (control circuit bottom surface ground terminal) of the multilayer substrate, thereby preventing interference between the ground path of the control circuit of the high-frequency switch and lines that transmit a transmission/reception signal.

The bottom surface connection terminal preferably is arranged at a position that is under the top surface connection electrode to which the control circuit ground terminal is connected and that is overlapped by the top surface connection electrode in plan view.

This configuration allows the control circuit ground terminal to be directly connected to the bottom surface connection terminal (control circuit bottom surface ground terminal) of the multilayer substrate through a short path, thereby preventing interference between the ground path of the control circuit of the high-frequency switch and lines that transmit a transmission/reception signal.

The ground electrode is arranged at a position that does not overlap, in plan view, a bottom surface connection terminal, among the bottom surface connection terminals, electrically connected to the control circuit ground terminal.

This configuration prevents generation of undesired capacitance between the control circuit ground terminal and the bottom surface connection terminal (control circuit bottom surface ground terminal), thereby preventing leakage of a high-frequency signal and noise more reliably.

It is preferable that the high-frequency terminals include a transmission signal input terminal, a low pass filter is connected to the transmission signal input terminal, the low pass filter is defined by the electrodes within the multilayer substrate, and the low pass filter is arranged between the ground electrodes located at positions that are different from each other in the stacking direction of the multilayer substrate.

This configuration prevents leakage of a transmission signal from the low pass filter, thereby reducing interference between the control circuit and transmission circuit of the high frequency switch.

According to various preferred embodiments of the present invention, a high-power signal such as a transmission signal is prevented from leaking to the control circuit (logic circuit unit) of a high-frequency switch through a ground electrode on the high-frequency side. In addition, noise generated in the control circuit (logic circuit unit) of the high-frequency switch is prevented from leaking to the transmission path of a high-frequency signal. As a result, a high-frequency switch module is realized in which deterioration of high-frequency characteristics is prevented and significantly reduced and, specifically, harmonic wave distortion characteristics are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A high-frequency switch module according to a first preferred embodiment will be described with reference to FIGS. 2 to 6.

Figure 1:
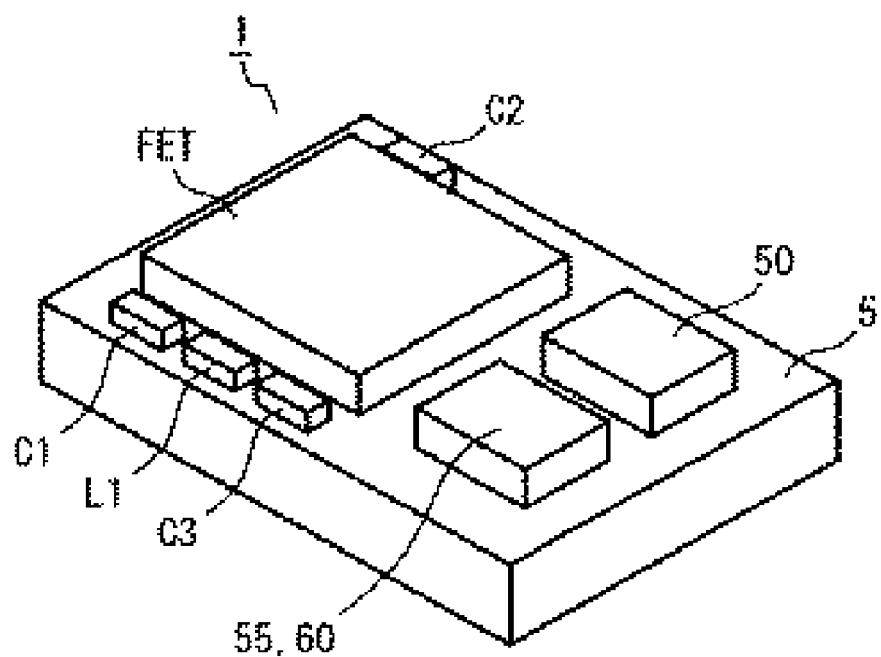
FIG. 1 is a perspective view of a high-frequency switch module disclosed in Japanese Unexamined Patent Application Publication No. 2008-271420.
Figure 2:
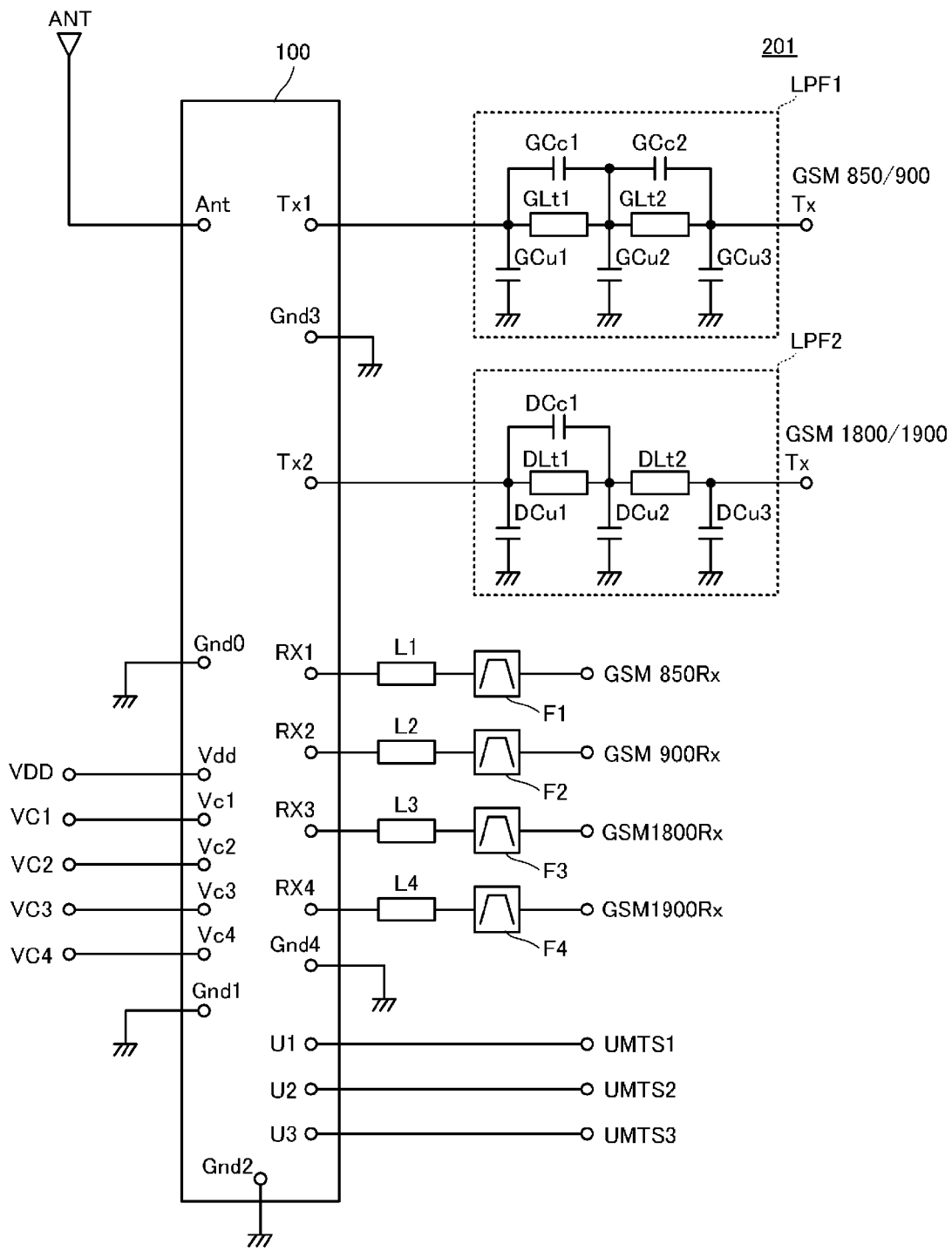
FIG. 2 is a circuit diagram of a high-frequency switch module according to a first preferred embodiment of the present invention.

FIG. 2 is a circuit diagram of a high-frequency switch module 201 according to the first preferred embodiment of the present invention. The high-frequency switch module 201 includes a high-frequency switch 100 and includes low pass filters LPF1 and LPF2, SAW filters F1, F2, F3, and F4, and matching circuits L1, L2, L3, and L4 connected to the high-frequency switch 100.

The high-frequency switch 100 includes a plurality of high-frequency terminals Tx1, Tx2, Rx1, Rx2, Rx3, Rx4, U1, U2, U3, an antenna terminal Ant, control terminals Vc1, Vc2, Vc3, and Vc4, a power supply terminal Vdd, and ground terminals Gnd0 to Gnd4.

Among the plurality of the high-frequency terminals, the terminal Tx1 is a transmission signal input terminal for GSM 850/900 and the terminal Tx2 is a transmission signal input terminal for GSM 1800/1900. The terminal Rx1 is a received signal output terminal for GSM 850, the terminal Rx2 is a received signal output terminal for GSM 900, the terminal Rx3 is a received signal output terminal for GSM 1800, and the terminal Rx4 is a received signal output terminal for GSM 1900. The terminal U1 is an input/output terminal for UMTS1 (for example, UMTS 800 in the 800 MHz band), the terminal U2 is an input/output terminal for UMTS2 (for example, UMTS 850 in the 850 MHz band), and the terminal U3 is an input/output terminal for UMTS3 (for example, UMTS 2100 in the 2100 MHz band).

An antenna ANT is connected to the antenna terminal Ant.

The control terminals Vc1 to Vc4 respectively receive control voltage signals VC1 to VC4 and cause the antenna terminal Ant to be selectively electrically connected to a given high-frequency terminal among the plurality of the high-frequency terminals. In other words, the high-frequency switch 100, which is a single-pole 9-throw (SP9T) switch, electrically connects the antenna terminal Ant to the terminal Tx1, when, for example, a GSM 850/900 transmission signal is to be output.

Figure 3:
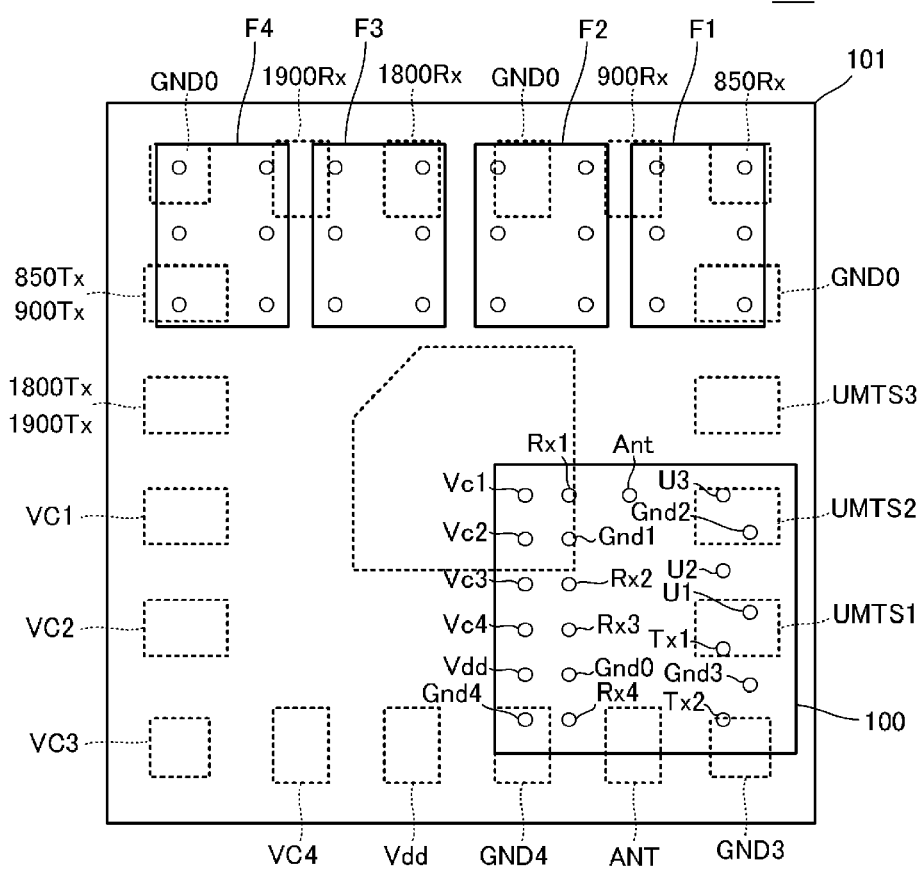
FIG. 3 is a top view of the high-frequency switch module according to the first preferred embodiment of the present invention.

FIG. 3 is a top view of the high-frequency switch module according to the first preferred embodiment. The high-frequency switch module 201 has a configuration in which the high-frequency switch 100 and the SAW filters F1 to F4 are provided on the top surface of a multilayer substrate 101. The low pass filters LPF1 and LPF2 illustrated in FIG. 2 are defined by wiring electrodes within the multilayer substrate 101 and/or components mounted on the top surface of the multilayer substrate 101. The multilayer substrate 101 is a ceramic multilayer substrate in which insulators (dielectric ceramics) and wiring electrodes are alternately stacked. The high-frequency switch 100 is located on a semiconductor substrate that is preferably rectangular plate-shaped, for example. The plurality of the high-frequency terminals and control terminals, the power supply terminal and ground terminals of the high-frequency switch 100 are located on one main surface (bottom surface) of the semiconductor substrate. Note that the multilayer substrate 101 may be formed of a resin such as a liquid crystal polymer.

Top surface electrodes to be connected to the various terminals of the high-frequency switch 100 are located on the top surface of the multilayer substrate 101. As illustrated by broken lines in FIG. 3, bottom surface connection terminals to be connected to the electrodes of a circuit board to which the high-frequency switch module 201 is mounted are located on the bottom surface of the multilayer substrate 101.

Figure 4:
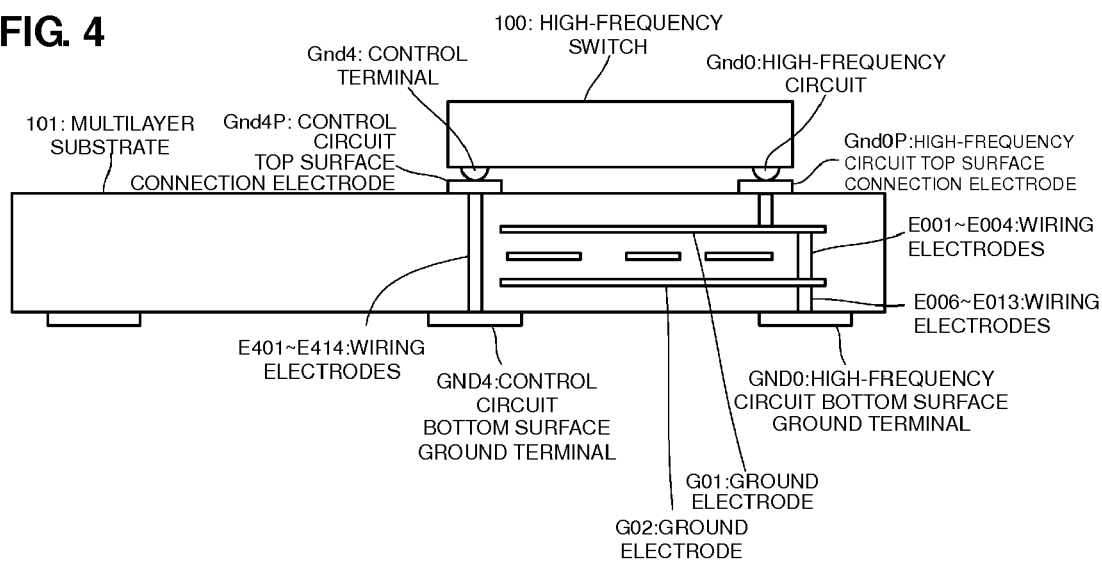
FIG. 4 is a sectional view illustrating the connection relationship between a high-frequency switch 100 illustrated in FIG. 2 and a multilayer substrate 101.

FIG. 4 is a sectional view illustrating the connection relationship between the high-frequency switch 100 and the multilayer substrate 101 illustrated in FIG. 2. Note that hatching that represents cross sectional portions has been omitted to simplify the figure.

Referring to FIG. 4, wiring electrodes E401 to E414, E001 to E004, E006 to E013, ground electrodes G01 and G02, and the like are disposed within the multilayer substrate 101. Illustration of other wiring electrodes within the multilayer substrate 101 has been omitted.

A control circuit top surface connection electrode Gnd4P, among the top surface connection electrodes located on the top surface of the multilayer substrate 101, to which a control circuit ground terminal Gnd4 is connected, is connected to a control circuit bottom surface ground terminal GND4 among the bottom surface connection terminals of the multilayer substrate 101 through the wiring electrodes E401 to E414.

A high-frequency circuit top surface connection electrode Gnd0P, among the top surface connection electrodes located on the top surface of the multilayer substrate 101, to which a high-frequency circuit ground terminal Gnd0 is connected, is connected to a high-frequency circuit bottom surface ground terminal GND0 among the bottom surface connection terminals of the multilayer substrate 101 through the wiring electrodes E001 to E004 and E006 to E013. The high-frequency circuit top surface connection electrode Gnd0P is connected to the ground electrodes G01 and G02 within the multilayer substrate 101 through the wiring electrodes E001 to E004 and E006 to E013. As will be described later, the low pass filters LPF1 and LPF2 are arranged between the two ground electrodes G01 and G02.

Note that the terminals of the high-frequency switch 100 according to the present preferred embodiment are preferably formed of Au bumps or solder bumps, and the high-frequency switch 100 is mounted face-down with its circuit-containing surface facing the top surface of the multilayer substrate 101.

Figure 5A:
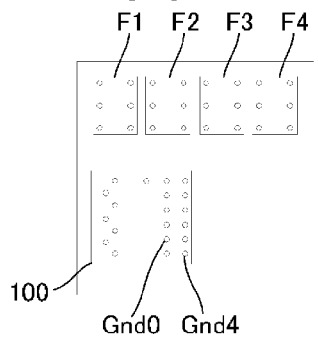
FIGS. 5A to 5H are diagrams illustrating the configurations of layers of the multilayer substrate 101 illustrated in FIG. 3 and FIG. 4.
Figure 5E:
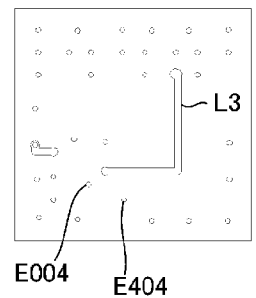
Figure 5B:
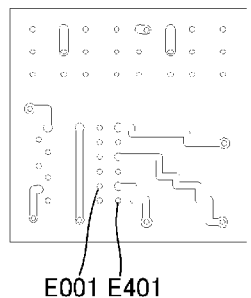
Figure 5F:
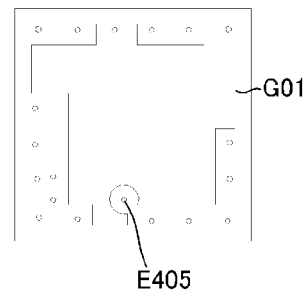
Figure 5C:
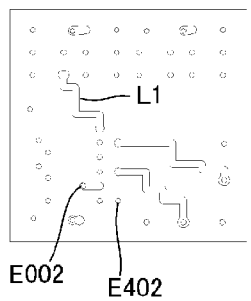
Figure 5G:
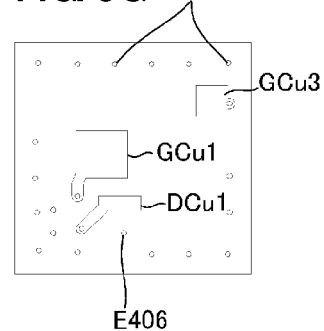
Figure 5D:
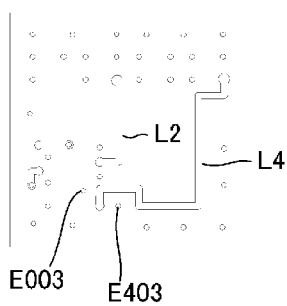
Figure 5H:
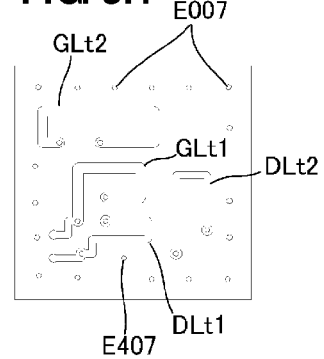
Figure 6A:
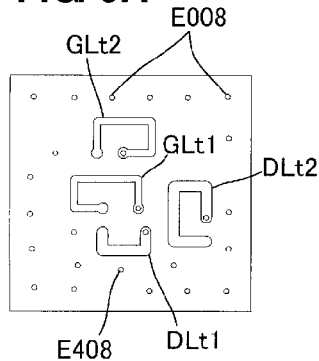
FIGS. 6A to 6H are diagrams, continued from FIGS. 5A to 5H, illustrating the configurations of the layers of the multilayer substrate 101.
Figure 6B:
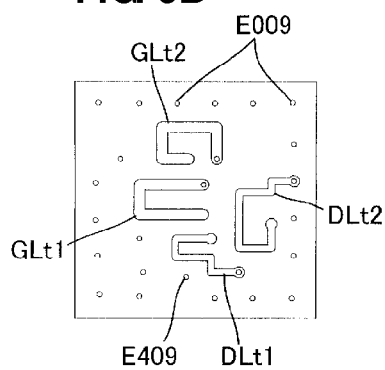
Figure 6C:
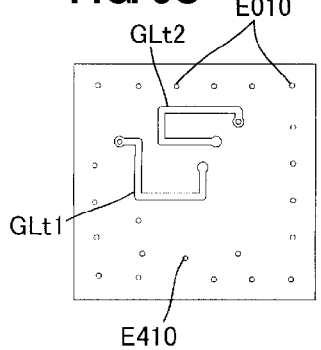
Figure 6D:
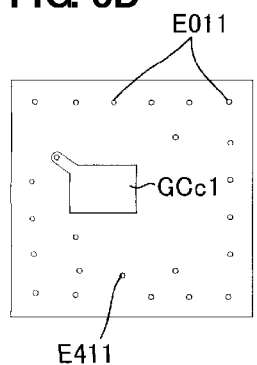
Figure 6E:
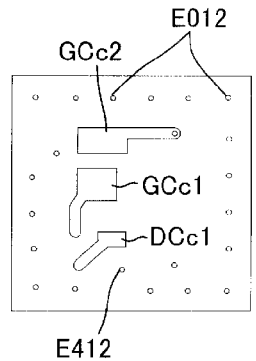
Figure 6F:
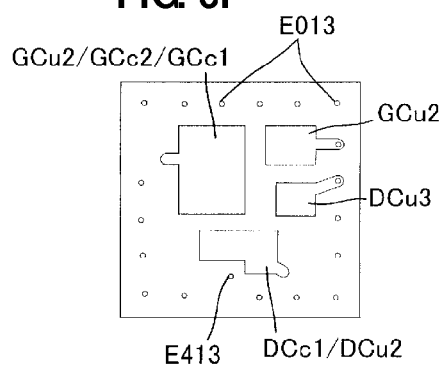
Figure 6G:
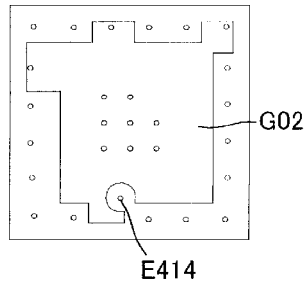
Figure 6H:
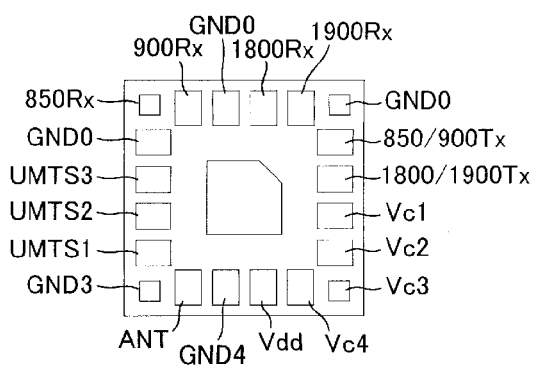

FIGS. 5A to 5H and FIGS. 6A to 6H are diagrams illustrating the configurations of the layers of the multilayer substrate 101. FIGS. 5A to 5H continue in FIGS. 6A to 6H. FIG. 5A illustrates the uppermost layer of the multilayer substrate 101, and FIG. 6H illustrates the lowermost layer. Each figure illustrates a layer viewed from the bottom surface toward the top surface. Hence, FIG. 5A illustrates the bottom surface views of the high-frequency switch 100 and the SAW filters F1 to F4, which are mounted on the top surface of the multilayer substrate.

In each layer, small circle patterns are via holes and other patterns are lines extending along the surface, electrodes that define inductors, and electrodes that define capacitors. Symbols illustrated in FIGS. 5A to 5H and 6A to 6H are the same as those of the circuit components illustrated in FIG. 2. These wiring electrodes define the low pass filters LPF1 and LPF2 illustrated in FIG. 2.

In FIGS. 5A to 5H, when focusing on the control circuit ground terminal Gnd4 of the high-frequency switch 100, it is finally electrically connected to the control circuit bottom surface ground terminal GND4 through the wiring electrodes (via holes) along a path E401→E402→E403→E404→E405→E406→E407→E408→E409→E410→E411→E412→E413→E414.

On the other hand, when focusing on the high-frequency circuit ground terminal Gnd0 of the high-frequency switch 100, it is finally electrically connected to the high-frequency circuit bottom surface ground terminal GND0 through the wiring electrodes and ground electrodes along a path E001→E002→E003→E004→G01→E006→E007→E008→E009→E010→E011→E012→E013→G02.

Inductors and capacitors are located between the ground electrodes G01 and G02 within the multilayer substrate 101 by a plurality of wiring electrodes, and these inductors and capacitors define the low pass filters LPF1 and LPF2 illustrated in FIG. 2.

Thus, since the control circuit ground terminal Gnd4 and high-frequency circuit ground terminal Gnd0 of the high-frequency switch 100 are respectively and separately connected to the control circuit bottom surface ground terminal GND4 and high-frequency circuit bottom surface ground terminal GND0 of the multilayer substrate 101, a transmission signal generated by the transmission circuit or the like is prevented from leaking to the control circuit (logic circuit unit) of the high-frequency switch through the ground path.

In addition, since the wiring electrodes E401 to E414, which are electrically connected to the top surface connection electrode to which the control circuit ground terminal Gnd4 is connected, are arranged under the control circuit top surface connection electrode Gnd4P, and also since the control circuit bottom surface ground terminal GND4 is arranged under the control circuit top surface connection electrode Gnd4P to which the control circuit ground terminal Gnd4 is connected, the control circuit ground terminal Gnd4 is connected to the control circuit bottom surface ground terminal GND4 without going through unnecessary wiring lines, thereby preventing interference between the ground path of the control circuit of the high-frequency switch and lines that transmit a transmission/reception signal.

Further, since the low pass filters LPF1 and LPF2, which are connected to the transmission signal input terminals Tx1 and Tx2 of the high-frequency switch 100, are arranged between the two ground electrodes G01 and G02 within the multilayer substrate 101, a transmission signal is prevented from leaking from the low pass filters LPF1 and LPF2, whereby interference between the control circuit and transmission circuit of the high-frequency switch is prevented and significantly reduced.

Second Preferred Embodiment

Figure 7A:
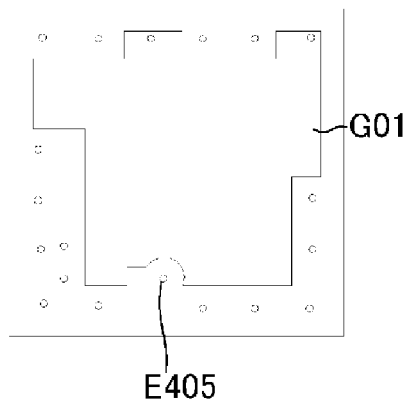
FIGS. 7A to 7C are diagrams illustrating a high-frequency switch module according to a second preferred embodiment of the present invention.
Figure 7B:
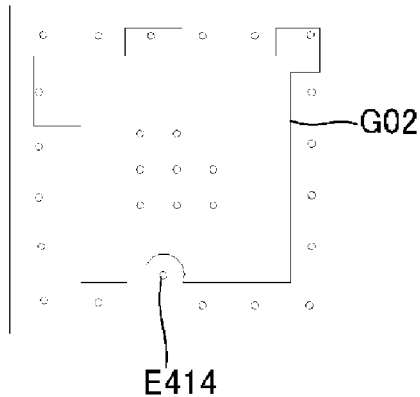
Figure 7C:
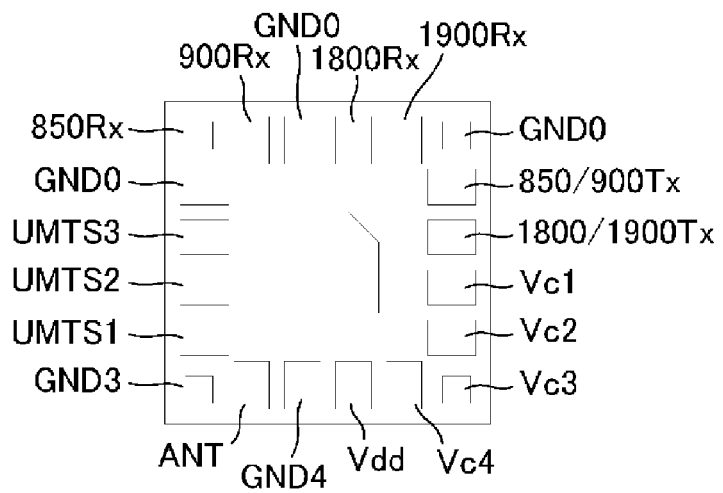

FIGS. 7A to 7C are diagrams illustrating a high-frequency switch module according to a second preferred embodiment. FIGS. 7A and 7C specifically illustrate the configurations of three layers among the layers of a multilayer substrate. The difference between the multilayer substrate in FIGS. 7A to 7C and the multilayer substrate illustrated in FIGS. 5A to 5H and FIGS. 6A to 6H of the first preferred embodiment preferably is that the shapes of the ground electrodes G01 and G02 are different. The rest of the configurations are preferably the same as those of the first preferred embodiment.

In the second preferred embodiment, wiring electrodes (via holes) E405, E414, and the like are arranged in an area which is not surrounded by the ground electrodes G01 and G02 in plan view. The wiring electrodes E405 and E414 are electrically connected to the control circuit top surface connection electrode Gnd4P to which the control circuit ground terminal Gnd4 is connected. In other words, the ground electrodes G01 and G02 are located in areas which do not surround, in plan view, positions where the wiring electrodes (via holes) E405, E414, and the like electrically connected to the control circuit top surface connection electrode Gnd4P are formed.

Further, the ground electrodes G01 and G02 are arranged at positions which do not overlap the control circuit bottom surface ground terminal GND4 in plan view.

These configurations prevent generation of undesired capacitance between the ground electrode for the control circuit and the ground electrode within the multilayer substrate and between the ground electrode for the control circuit and the control circuit bottom surface ground terminal. This prevents leakage of a high-frequency signal and noise more reliably.

Note that the control circuit bottom surface ground terminal and the high-frequency circuit bottom surface ground terminal may be arranged along sides of the multilayer substrate which are different from each other. This enables a reduction in capacitance generated between the control circuit bottom surface ground terminal and the high-frequency circuit bottom surface ground terminal, thereby preventing the leakage of a high-frequency signal and noise more reliably.

Further, the control terminal ground terminal GND4 may be arranged so as to be spaced apart from (not neighboring) power-applied terminals such as the UMTS terminals, transmission signal input terminals, and antenna terminal. This enables a further reduction in leakage of a high-frequency signal to the control circuit within the high-frequency switch.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency switch module comprising:
    a high-frequency switch that includes high-frequency terminals, a control terminal, a power supply terminal, and ground terminals and that is arranged to cause specific ones of the plurality of the high-frequency terminals to be selectively electrically connected to one another; and
    a multilayer substrate having a rectangular or substantially rectangular plate shape and including insulators and electrodes alternately stacked therein; wherein
    top surface connection electrodes to which the respective terminals of the high-frequency switch are connected are arranged on a top surface of the multilayer substrate, bottom surface connection electrodes which are connected to a circuit substrate to which the high-frequency switch module is mounted are arranged on a bottom surface of the multilayer substrate, and wiring electrodes that electrically connect the top surface connection electrodes to the bottom surface connection electrodes are located within the multilayer substrate;
    the ground terminals include a high-frequency circuit ground terminal and a control circuit ground terminal;
    the multilayer substrate includes therein a ground electrode electrically connected to the top surface connection electrode to which the high-frequency circuit ground terminal is connected; and
    the wiring electrode electrically connected to the top surface connection electrode to which the control circuit ground terminal is connected is arranged so as to be insulated from the ground electrode.

2. The high-frequency switch module according to claim 1, wherein a wiring electrode, among the wiring electrodes, electrically connected to the top surface connection electrode to which the control circuit ground terminal is connected, is arranged at a position that is not surrounded by the ground electrode in plan view.

3. The high-frequency switch module according to claim 1, wherein a wiring electrode, among the wiring electrodes, electrically connected to the top surface connection electrode to which the control circuit ground terminal is connected, is arranged under the top surface connection electrode to which the control circuit ground terminal is connected.

4. The high-frequency switch module according to claim 3, wherein the bottom surface connection terminal is arranged at a position that is under the top surface connection electrode to which the control circuit ground terminal is connected and that is overlapped by the top surface connection electrode in plan view.

5. The high-frequency switch module according to claim 1, wherein the ground electrode is arranged at a position that does not overlap, in plan view, a bottom surface connection terminal, among the bottom surface connection terminals, electrically connected to the control circuit ground terminal.

6. The high-frequency switch module according to claim 1, wherein the ground electrode is constituted by ground electrodes respectively located on a plurality of layers different from one another within the multilayer substrate, and the high-frequency terminals include a transmission signal input terminal, a low pass filter including the electrodes within the multilayer substrate is connected to the transmission signal input terminal, and the low pass filter is arranged between the ground electrodes respectively located on the plurality of the layers different from one another.

* * * * *